United States Patent
Haba

(10) Patent No.: US 7,417,871 B2
(45) Date of Patent: Aug. 26, 2008

(54) MEMORY MODULE

(75) Inventor: Belgacem Haba, Cupertino, CA (US)

(73) Assignee: Rambus Inc., Los Altos, CA (US)

(*) Notice: Subject to any disclaimer, the term of this patent is extended or adjusted under 35 U.S.C. 154(b) by 0 days.

(21) Appl. No.: 11/327,267

(22) Filed: Jan. 6, 2006

(65) Prior Publication Data

US 2006/0114661 A1 Jun. 1, 2006

Related U.S. Application Data

(63) Continuation of application No. 10/794,766, filed on Mar. 4, 2004, now Pat. No. 7,012,812, which is a continuation of application No. 10/098,520, filed on Mar. 13, 2002, now Pat. No. 6,721,189.

(51) Int. Cl.
*H05K 1/11* (2006.01)

(52) U.S. Cl. .................. 361/792; 361/760

(58) Field of Classification Search ........... 361/760, 361/741, 792, 748
See application file for complete search history.

(56) References Cited

U.S. PATENT DOCUMENTS

| | | | |
|---|---|---|---|
| 3,868,724 A | 2/1975 | Perrino | |
| 4,834,660 A | 5/1989 | Cotti | |
| 4,878,611 A * | 11/1989 | LoVasco et al. | 228/180.22 |
| 4,879,588 A | 11/1989 | Ohtsuka et al. | |
| 4,912,401 A * | 3/1990 | Nady et al. | 324/755 |
| 5,057,907 A | 10/1991 | Ooi et al. | |
| 5,229,916 A | 7/1993 | Frankeny et al. | |
| 5,276,418 A | 1/1994 | Klosowiak et al. | |
| 5,386,341 A | 1/1995 | Olson et al. | |
| 5,518,964 A | 5/1996 | DiStefano et al. | |
| 5,523,695 A * | 6/1996 | Lin | 324/755 |
| 5,550,406 A | 8/1996 | McCormick | |
| 5,703,436 A | 12/1997 | Forrest et al. | |
| 5,751,553 A | 5/1998 | Clayton | |
| 5,763,952 A | 6/1998 | Lynch et al. | |
| 5,777,345 A | 7/1998 | Loder et al. | |
| 5,804,004 A | 9/1998 | Tyckerman et al. | |
| 5,925,934 A | 7/1999 | Lim | |
| 5,926,369 A | 7/1999 | Ingraham et al. | |

(Continued)

OTHER PUBLICATIONS

U.S. Appl. No. 09/531,124, filed Mar. 17, 2000, Haba.

(Continued)

*Primary Examiner*—Hung S Bui
(74) *Attorney, Agent, or Firm*—Morgan, Lewis & Bockius LLP

(57) ABSTRACT

The memory module includes a substantially rigid first circuit board having at least one memory chip disposed thereon. The memory module also includes a substantially rigid second circuit board having an array of electrical contact points disposed on a planar surface thereof. A flexible connector electrically couples the first circuit board to the second circuit board, such that the memory chip is electrically connected to the array of electrical contact points. Alternatively, The memory module that a rigid/flex circuit board. The rigid/flex circuit board includes a substantially rigid first section having at least one memory chip disposed thereon, and a substantially rigid second section having an array of electrical contact points disposed on a planar surface thereof. The rigid/flex circuit board also includes a flexible third section in-between the first section to the second section.

33 Claims, 11 Drawing Sheets

U.S. PATENT DOCUMENTS

| | | |
|---|---|---|
| 5,926,951 A | 7/1999 | Khandros et al. |
| 5,936,850 A | 8/1999 | Takahashi et al. |
| 5,940,721 A | 8/1999 | Kinzer et al. |
| 5,949,657 A | 9/1999 | Karabatsos |
| 5,959,839 A | 9/1999 | Gates |
| 5,963,427 A | 10/1999 | Bollesen |
| 5,995,370 A | 11/1999 | Nakamori |
| 5,998,864 A | 12/1999 | Khandros et al. |
| 6,002,589 A | 12/1999 | Perino et al. |
| 6,005,778 A | 12/1999 | Spielberger et al. |
| 6,023,103 A | 2/2000 | Chang et al. |
| 6,034,878 A | 3/2000 | Osaka et al. |
| 6,040,624 A | 3/2000 | Chambers et al. |
| 6,072,700 A | 6/2000 | Nam |
| 6,093,969 A | 7/2000 | Lin |
| 6,133,629 A | 10/2000 | Han et al. |
| 6,180,881 B1 | 1/2001 | Isaak |
| 6,181,002 B1 | 1/2001 | Juso et al. |
| 6,184,587 B1 | 2/2001 | Khandros et al. |
| 6,215,182 B1 | 4/2001 | Ozawa et al. |
| 6,229,217 B1 | 5/2001 | Fukui et al. |
| 6,376,904 B1 | 4/2002 | Haba et al. |
| 6,449,159 B1 | 9/2002 | Haba |
| 6,514,794 B2 | 2/2003 | Haba et al. |
| 6,520,789 B2 | 2/2003 | Daugherty, Jr. et al. |
| 6,532,157 B1 | 3/2003 | Glenn et al. |
| 6,618,938 B1 | 9/2003 | Alagaratnam et al. |
| 6,721,189 B1 | 4/2004 | Haba |
| 6,833,984 B1 | 12/2004 | Balgacem |
| 2003/0169578 A1 | 9/2003 | Blazic et al. |

OTHER PUBLICATIONS

U.S. Appl. No. 10/087,395, filed Mar. 1, 2002, Haba et al.

* cited by examiner

MEMORY MODULE

CROSS REFERENCE TO RELATED CASES

This application is a continuation of prior application 10/794,766, filed Mar. 4, 2004, now U.S. Pat. No. 7,012,812, which is a continuation of prior application 10/098,520, filed Mar. 13, 2002, now U.S. Pat. No. 6,721,189, both of which are hereby incorporated by reference in their entirety.

BACKGROUND OF THE INVENTION

1. Field of the Invention

The present invention relates generally to memory modules, and in particular a memory module that connects circuit boards via an area array.

2. Description of Related Art

The semiconductor industry is constantly producing smaller and more complex semiconductors, sometimes called integrated circuits or chips. This trend has brought about the need for smaller semiconductor chip packages with smaller footprints, higher lead counts, and better electrical and thermal performance, while at the same time meeting accepted reliability standards.

In complex microelectronic devices, different semiconductor components connect to one another through various types of connectors. The reliability of these connectors is critical to the proper functioning of these microelectronic devices. However, as such microelectronic devices become smaller and more complex, the density of input and output electrical contacts on the devices increases. This means that the pitch or space between such contacts is continually decreasing. For example, semiconductor chips today contain up to 2000 pins per square inch, requiring a pitch as small as 0.003 inches.

In addition, as the number of pins on semiconductor chips increases, the number of contacts on the circuit boards carrying these semiconductor chips also increases. Therefore, today's circuit board connectors need to have a high density of contacts with a small pitch. However, it becomes increasingly more difficult for reliable contact to be made, as pitch decreases.

There are common situations where it is desirable to connect two circuit boards to one another. For example, it may be desirable to couple a circuit board of a memory module to a target board, such as a motherboard. Such memory modules include Dual In-line Memory Modules (DIMMs), Single In-line Memory Modules (SIMMs), RAMBUS In-line Memory Modules (RIMMs), or the like. Typically, these memory modules connect to a target board via a male card edge connector that mates with a female card edge connector or socket on the target board.

FIG. 1A is a front view of such a prior art memory module 100 including a male card edge connector 103 and its corresponding female card edge connector or socket 104 on a target board 106. The edge card connector 103 includes a set of pins or contact pads 102 located along an edge of a memory module 100. These contact pads 102 electrically engage with corresponding contacts in the socket 104, which is soldered onto a target board 106. Each memory module 100 typically includes of a number of memory chips 101.

FIG. 1B is a side view of the prior art memory module 100 shown in FIG. 1A. A disadvantage of such a male card edge connector 103 is that the number of contact pads 102 that can be placed along the edge of the memory module 100 is very limited. As the demand for memory capacity increases, so does the number of semiconductor chips 101 required per memory module 100. This increase in the number of semiconductor chips 101 leads to an increase in the number and density of contact pads 102 on the memory modules 100.

As the density of the contact pads 102 increases, it becomes more difficult to provide reliable electrical contact due to inherent surface irregularities on the circuit board and contact pads. These surface irregularities may prevent some of the contact pads from making contact with corresponding contacts in the socket 104. Additionally, interference, such as electrical fields, generated between contact pads limit how close contact pads may be placed to one another. Additionally, these female card edge type connectors or sockets occupy a relatively large footprint on the target board and also substantially increasing the height of the target board. In light of the above, card edge connectors are becoming increasingly undesirable in today's ever shrinking microelectronics devices.

Another way of packaging microelectronic devices, in order to achieve higher counts of input and output electrical contacts, is by employing area arrays. An area array 202, shown in FIG. 2A, comprises a group of contact pads 200 arranged in a matrix on a circuit board 201. Area arrays 202 allow connectors to have more contacts spaced sufficiently far away from one another to avoid the drawbacks associated with card edge connectors.

Connectors such as DELPHI CONNECTION SYSTEMS' GOLD DOT connector utilize area arrays to connect circuit boards to each other. FIG. 2B shows a side view and FIG. 2C shows a front view of such a prior art GOLD DOT connector 205, as viewed along arrow 2C of FIG. 2B. The GOLD DOT connector 205 comprises two sets of gold plated pins or "dots" 204(1) and 204(2) contained on a flexible circuit board 203. The flexible circuit board is usually shaped by mounting on a block 212 or a bracket so as to create a rigid connection between a circuit board 208 and a target board 206. Pins 204(1) to 204(2) make contact with the contact pads 210(1) and 210(2) located in area arrays on the circuit board 208 and the target board 206, respectively. The boards 206 and 208 are kept in contact with the GOLD DOT connector 205 by clamping each of the boards 206 and 208 to the GOLD DOT connector using two separate clamps (not shown).

A disadvantage of this type of connector is the high number of contact "dots" that comprise the two sets of pins 204(1) and 204(2). The additional contact points increase the likelihood of inadequate electrical connections being formed. Also, because GOLD DOTs currently cost up to $0.02/dot, the GOLD DOT connectors make large arrays prohibitively expensive. Another drawback of the GOLD DOT connector is the use of two separate clamps, which increases the cost and size of the connector arrangement.

In view of the foregoing, it would be highly desirable to provide an electrical connector that addresses the abovementioned drawbacks, while providing connector that is reliable at a low associated cost per electrical connector.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

The present invention is directed toward a memory module comprising two circuit boards electrically coupled together by means of a flexible electrical connector that is capable of connecting to a target circuit board through an area array. This electrical connector addresses the problems associated with the prior art by providing a high density of electrical contacts that take up less space and provides higher reliability and lower cost compared to the prior art.

According to the invention there is provided a memory module. The memory module includes a substantially rigid first circuit board having at least one memory chip disposed thereon. The memory module also includes a substantially rigid second circuit board having an array of electrical contact points disposed on a planar surface thereof. A flexible connector electrically couples the first circuit board to the second circuit board, such that the memory chip is electrically connected to the array of electrical contact points.

Further according to the invention there is provided another memory module that includes a rigid/flex circuit board. The rigid/flex circuit board includes a substantially rigid first section having at least one memory chip disposed thereon, and a substantially rigid second section having an array of electrical contact points disposed on a planar surface thereof. The rigid/flex circuit board also includes a flexible third section in-between the first section to the second section.

Still further according to the invention there is provided a method for using a memory module. A substantially rigid first circuit board is provided having at least one memory chip disposed thereon. A substantially rigid second circuit board is provided having an array of electrical contact points disposed on a planar surface thereof. The first circuit board is electrically coupled to the second circuit board via a flexible connector. The electrical contact points are electrically connected to a land grid array socket. Furthermore, the land grid array socket is electrically connected to a target board.

Figure 1A:
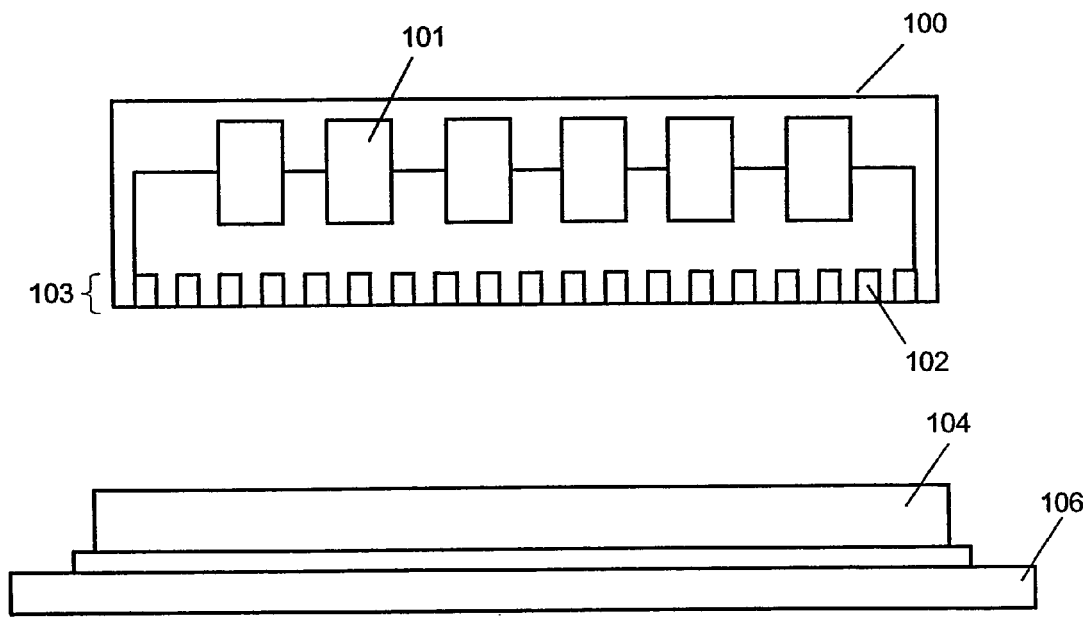
FIG. 1A is a front view of a prior art memory module having an edge card connector.
Figure 1B:
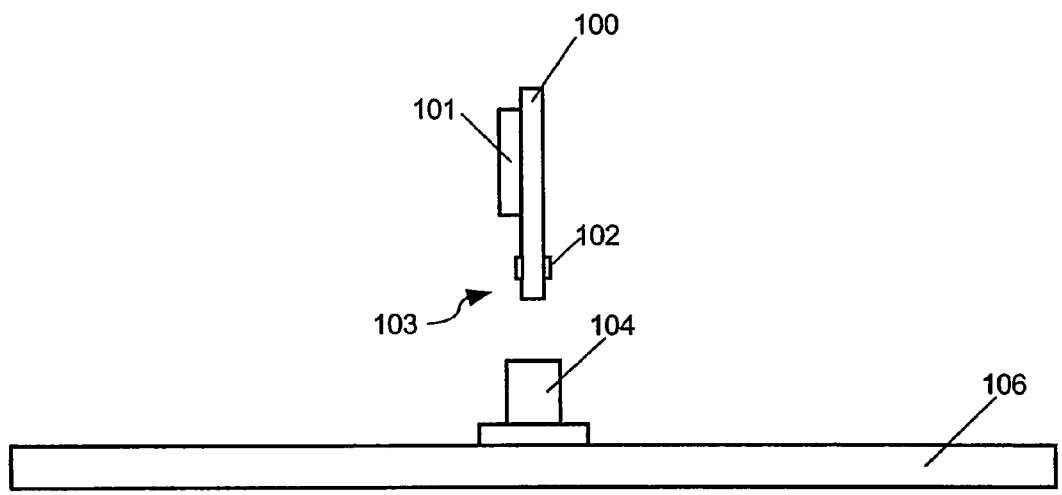
FIG. 1B is a side view of the prior art memory module shown in FIG. 1A.
Figure 2A:
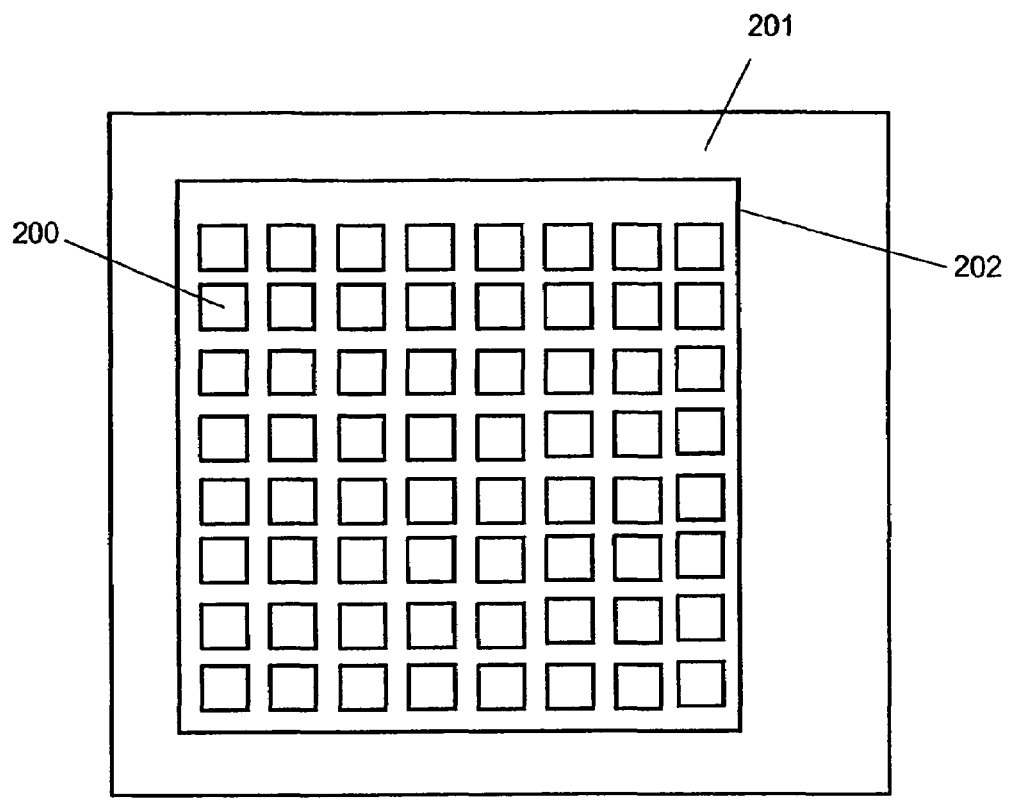
FIG. 2A is a top view of another prior art device.
Figure 2B:
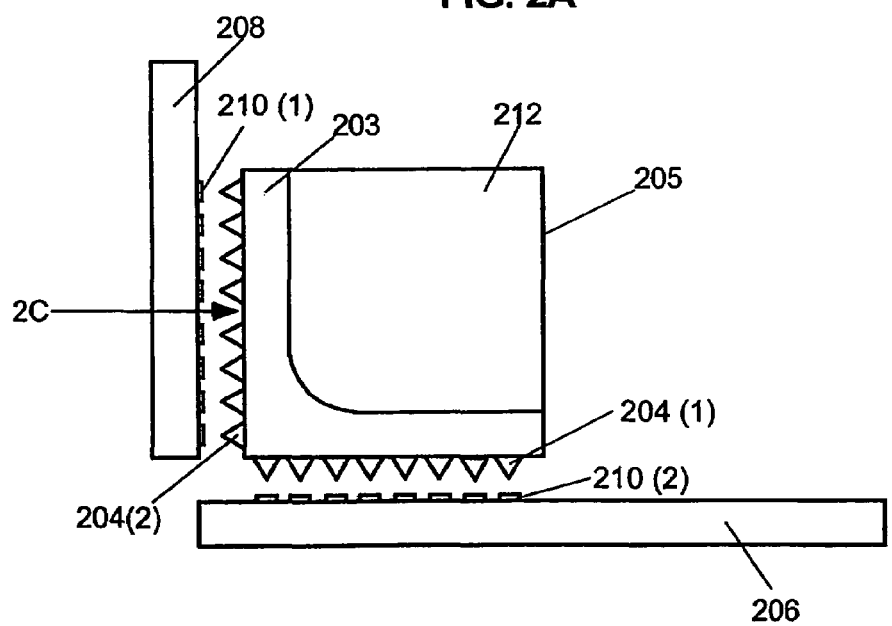
FIG. 2B shows a prior art circuit board assembly using a GOLD DOT connector.
Figure 2C:
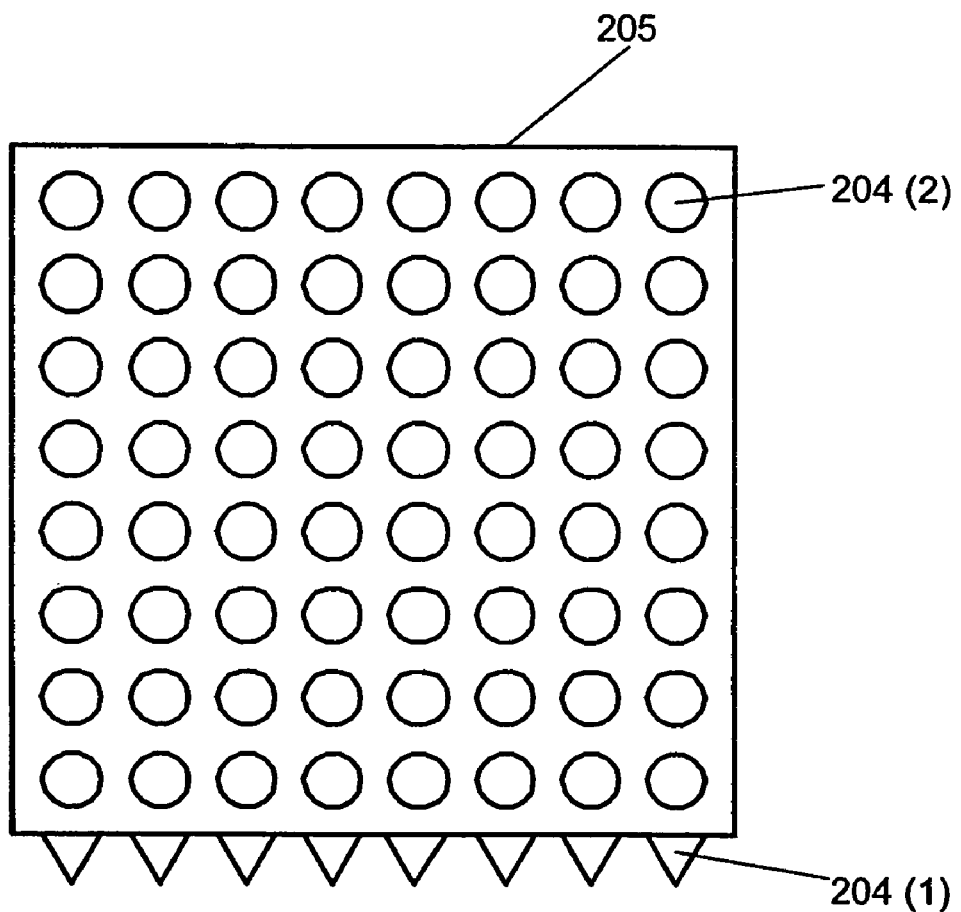
FIG. 2C is a front view of the connector shown in FIG. 2B.
Figure 3A:
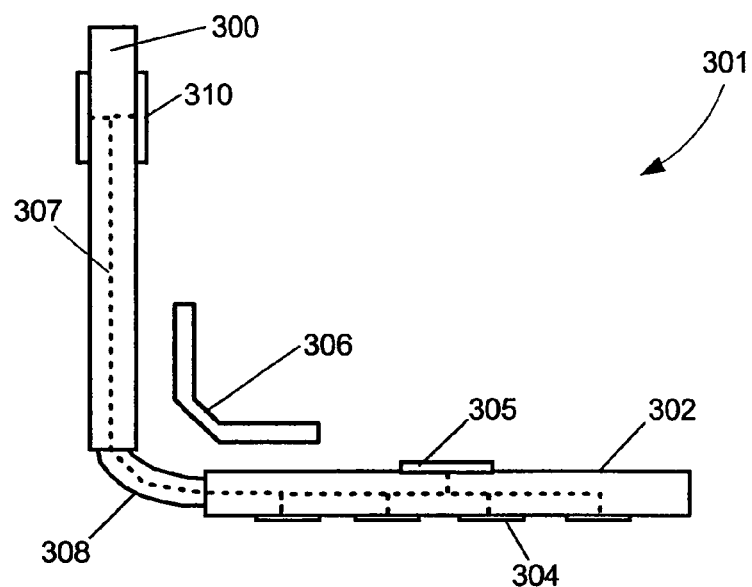
FIG. 3A is a side view of a memory module according to an embodiment of the invention.
Figure 3B:
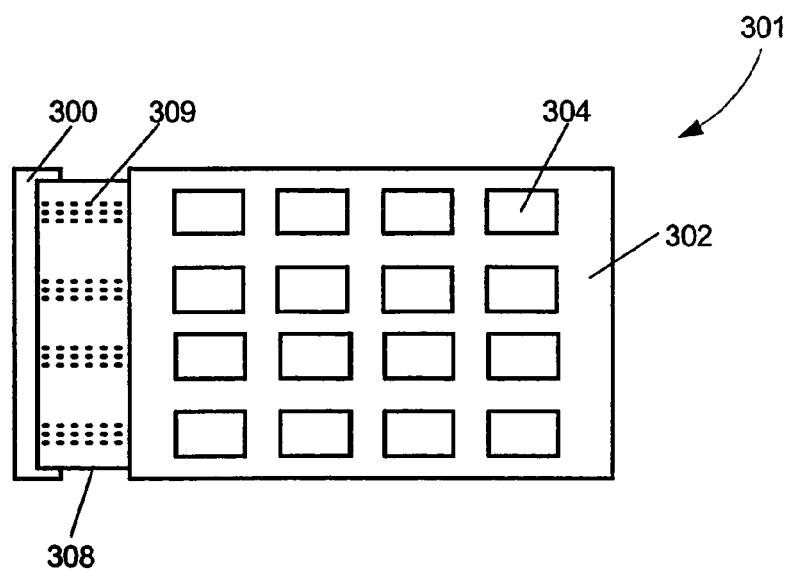
FIG. 3B is a bottom view of the memory module shown in FIG. 3A.

FIG. 3A is a side view of a memory module 301, while FIG. 3B is a bottom view of the memory module 301 shown in FIG. 3A. Memory module 301 comprises a first substantially rigid circuit board 300 and a second substantially rigid circuit board 302 electrically coupled to the first circuit board 300. First and second circuit boards 300 and 302 are preferably made from FR4 (Flame Retardant 4), which is a widely-used insulating material for making printed circuit boards and is constructed of woven glass fibers (fiberglass) that are epoxied together. First and second circuit boards 300 and 302 are also preferably planar, i.e., flat having a two-dimensional characteristic with a relatively small thickness.

The two circuit boards 300 and 302 are electrically coupled to one another by a flexible electrical connector 308. Furthermore, the first circuit board 300 includes at least one memory chip 310. The memory chip 310 is preferably a semiconductor chip that holds programs and data either temporarily (RAM), permanently (ROM, PROM) or permanently until changed (EPROM, EEPROM, flash memory). The memory chips 310 may be disposed on one or both sides of the first circuit board 300.

The first circuit board 300 and second circuit board 302 are preferably arranged substantially perpendicular to one another, as shown in FIG. 3A. Alternatively, the angle between the circuit boards 300 and 302 may vary depending on the specific packaging requirements. The angle between the two circuit boards 300 and 302 is preferably maintained by attaching both circuit boards 300 and 302 to a bracket 306. The bracket 306 may be made of any suitable material, including plastic or metal, and can be attached to the circuit boards 300 and 302 in various ways, including via adhesives, screws, rivets, or the like.

The second circuit board 302 includes an array of electrical contact points 304 located on one side, preferably a planar surface, of the second circuit board 302. These electrical contact points 304 are best seen in FIG. 3B. The electrical contact points 304 are configured to connect with corresponding contact points on a target circuit board, as shown and described in relation to FIGS. 7A, 7B, 8A, 8B, and 8C below.

In one embodiment, the second circuit board 302 is just large enough to contain the array of electrical contact points 304. This minimizes the footprint required for a connection on the target circuit board. The contact points on the second circuit board 302 may be of any shape and made of any electrically conductive material or combination of materials that is suitable to make a reliable electrical connection. Once such suitable material is gold. Each contact point 304 corresponds to another contact point on a target circuit board (not shown). In an alternative embodiment, additional memory chips 305 may be placed on the second circuit board 302.

The memory chips 310 on the first circuit board 300 are electrically connected to the electrical contacts 304 of the second circuit board 302 via electrical leads 307 and the flexible electrical connector 308. These electrical leads 307 are disposed on, or in, the first and second circuit boards 300 and 302 respectively. The flexible electrical connector 308 has electrical leads or wires 309 embedded in it to convey voltages and signals between the first and second circuit boards 300 and 302, respectively.

Figure 4A:
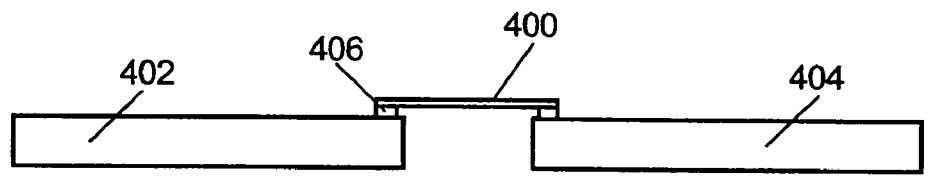
FIG. 4A is a side view of a flexible connector, according to another embodiment of the invention.
Figure 4B:
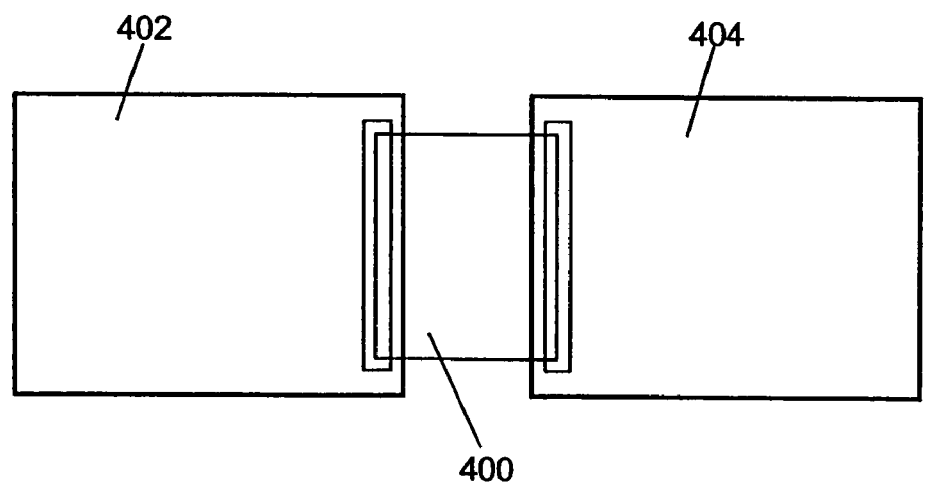
FIG. 4B is a top view of the flexible connector shown in FIG. 4A.

The flexible electrical connector 308 discussed above, may take multiple different forms. For example, as shown in FIG. 4A and FIG. 4B, the flexible electrical connector is a flexible circuit board 400. FIG. 4A is a side view, while FIG. 4B is a top view of the flexible connector. A first board 402 is electrically connected to a second board 404 using the flexible circuit 400. Furthermore, the flexible circuit 400 may be attached to the circuit boards 402 and 404 in a number of different ways. For example, the flexible circuit 400 may either be soldered onto the two boards 402 and 404 or connected via socket and pin connectors 406. In addition, more than one flexible circuit may be used to connect the two circuit boards 402 and 404 to one another.

Figure 5:
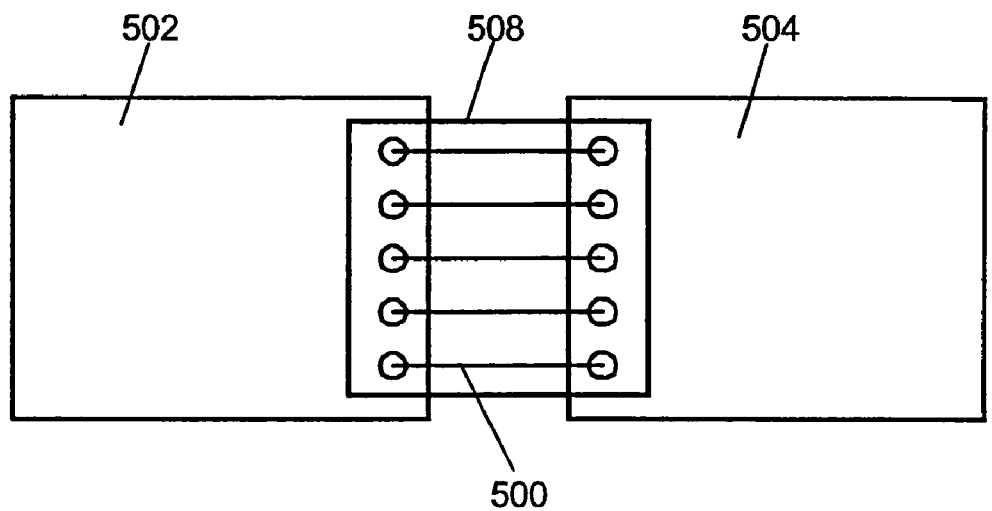
FIG. 5 is a top view of a flexible connector, according to another embodiment of the invention.

FIG. 5 is a top view of a flexible connector according to another embodiment of the invention. Here, the electrical connector is one or more electrical wires 500. A first circuit board 502 electrically connects to a second circuit board 504 via the electrical wires 500. The electrical wires may be of any suitable type available in the market, such as ribbon style cable 508, or the like. The electrical wires 500 are connected to the circuit boards 502 and 504 by any suitable means, such as soldering the wires onto electrical contact points on the circuit boards 502 and 504, through a socket mechanism, or the like.

Figure 6A:
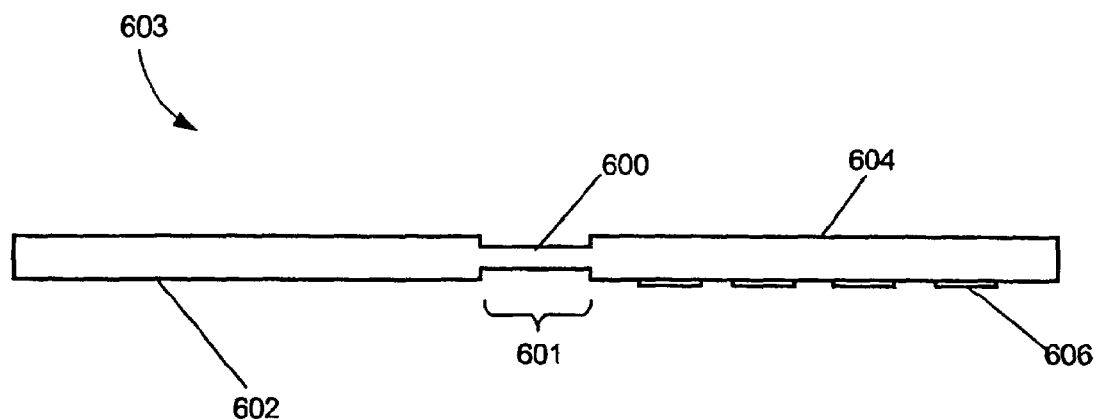
FIG. 6A is a side view of a memory module using a rigid/flex circuit board, according to still another embodiment of the invention.

Yet another embodiment of flexible connector is a rigid/flex circuit board used to make the memory module, as shown and described in relation to FIG. 6A. A rigid/flex circuit board is a circuit board that comprises both substantially rigid sections and substantially flexible sections, all part of one continuous circuit board.

FIG. 6A is a side view of a memory module using such a rigid/flex circuit board 603. The circuit board 603 contains an array of electrical contact points 606 on one section of the circuit board 604. A suitable rigid/flex circuit board is made by TELEDYNE INDUSTRIES INC., and disclosed in U.S. Pat. No. 5,591,519, which is hereby incorporated by reference. The rigid/flex circuit board 603 comprises two substantially rigid sections 602 and 604, and one substantially flexible section 600 located inbetween the two substantially rigid sections. The substantially rigid sections 602 and 604 are functional equivalents of the first and second substantially rigid circuit boards 300 and 302 described relation to FIG. 3A above. Accordingly, the first substantially rigid section 602 preferably includes a number of memory chips (not shown) and the second substantially rigid section 604 includes an array of electrical contact points 606.

Figure 6B:
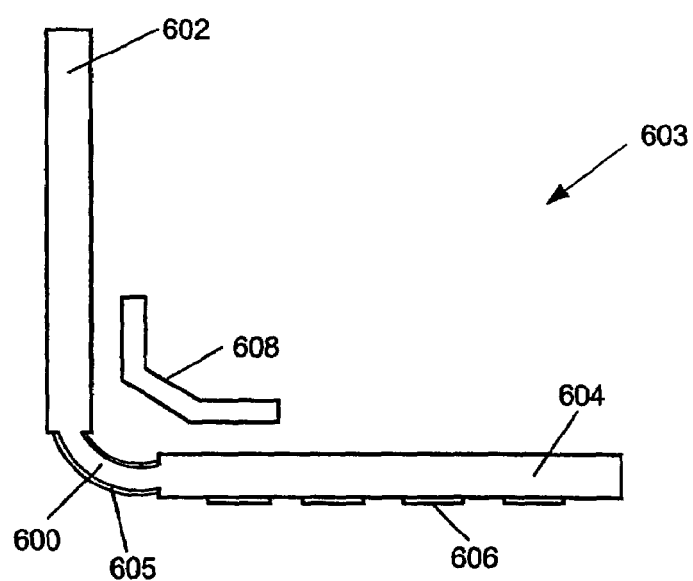
FIG. 6B is a side view of the memory module of FIG. 6A showing the rigid/flex circuit board in a perpendicular configuration.

FIG. 6B is a side view the memory module shown in FIG. 6A, where the first substantially rigid section 602 is configured perpendicular to the second substantially rigid section 604. A bracket 608 is preferably employed to position the two substantially rigid sections 602 and 604 at a desirable angle relative to each other. In a preferred embodiment this angle is approximately 90 degrees. The bracket 608 is preferably coupled to both substantially rigid sections 602 and 604 by any means suitable, including clamps, screws, rivets, or the like (not shown). Additionally, reinforcing material 605, such as a polyimide coat may be applied to the flexible portion of the circuit board 601 to make the flexible circuitry more durable.

Figure 7A:
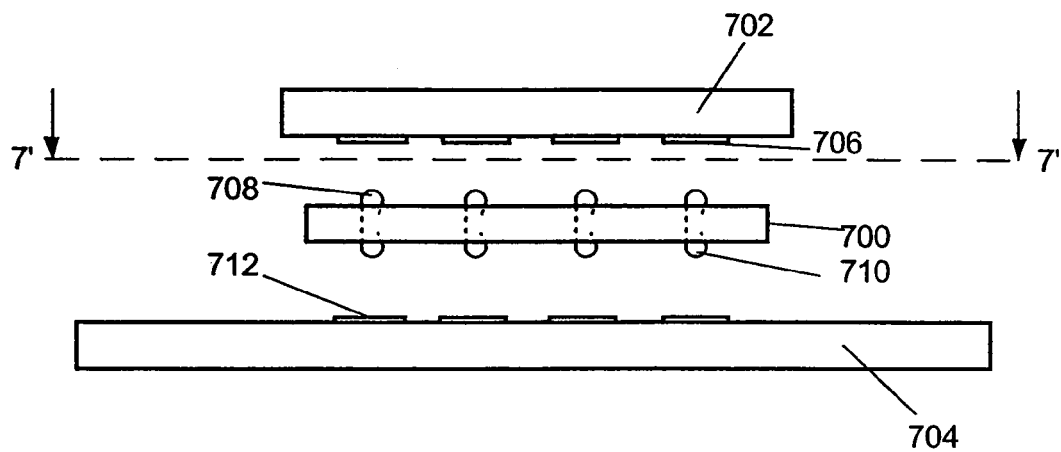
FIG. 7A is a side view of a land grid array socket connecting two circuit boards, according to still another embodiment of the invention.

FIG. 7A is a side view of an intermediary device 700, such as a land grid array (LGA) socket, for connecting a second circuit board or section 702 to a target board 704. The second circuit board or section 702 corresponds to the second circuit board 302 (FIG. 3A), 404 (FIGS. 4A and 4B), or 504 (FIG. 5), or the second rigid section 604 (FIGS. 6A and 6B). The intermediary device 700 is used to electrically connect a first area array, having first electrical contacts 706 on a circuit board 702, to a second area array, having second electrical contacts 712 on a target circuit board 704.

Because of inconsistencies in the planarity of the surface of either the second circuit board or section 702 or the electrical contact points 706, caused by manufacturing limitations, such an intermediary device is typically necessary to ensure electrical contact between the contact points 706 and 712. These surface irregularities typically cause some electrical contact points 706 to be seated higher or lower than adjacent contact points 706. The LGA socket 700 overcomes the abovementioned problem by providing a reliable conduit between the first and second contact points 706 and 712.

The LGA socket 700 is preferably a flat substrate with either pins, springs or other protruding structures 708 and 710 on one or both sides thereof. The form, material, and design of these protruding structures 708 and 710 are selected to ensure contact between the first and second contact points 706 and 712. The protruding structures 708 and 710 are preferably resilient along a line joining respective contacts 706 and 712. In a preferred embodiment, each of these protruding structures 708 and 710 is a single "C" shaped resilient metal insert that electrically couples a contact 706 on the second circuit board 702 to a corresponding contacts 712 on the target board 704.

The protruding structures 708 and 710 are placed on both sides of the socket 700, if a solderless connection is desired. A single clamp (not shown) is then used to force the circuit boards 702 and 704 toward one another. Alternatively, the LGA socket 700 may be fixed on one side to the target circuit board 704, such as by soldering the LGA socket 700 to the target circuit board 704.

Figure 7B:
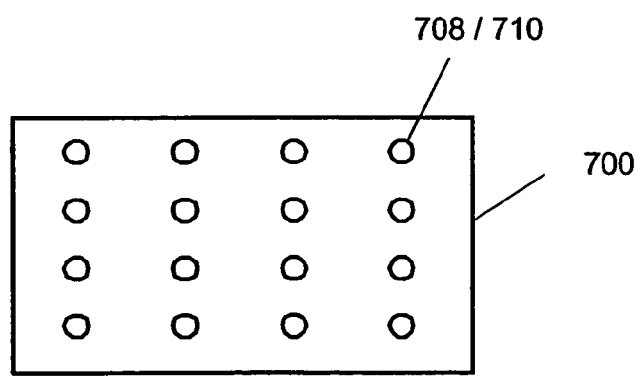
FIG. 7B is a bottom view of the land grid array socket shown in FIG. 7A.

FIG. 7B is a top view of the LGA socket 700, as viewed along line 7'-7'. This view shows the arrangement of the protruding structures 708 and 710 that correspond to the electrical contact points 706 and 712 on the circuit boards 702 and 704.

Figure 8A:
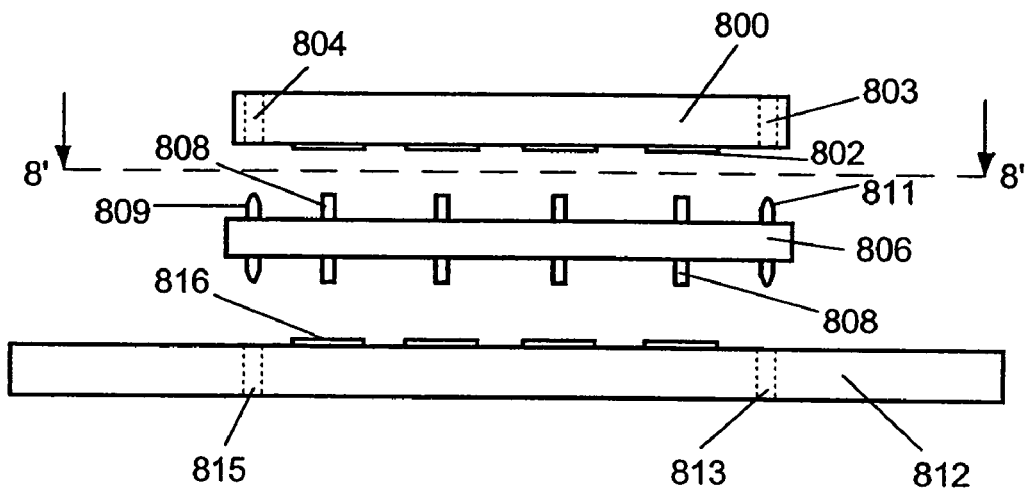
FIG. 8A is a side view of a guiding mechanism, according to another embodiment of the invention.
Figure 8B:
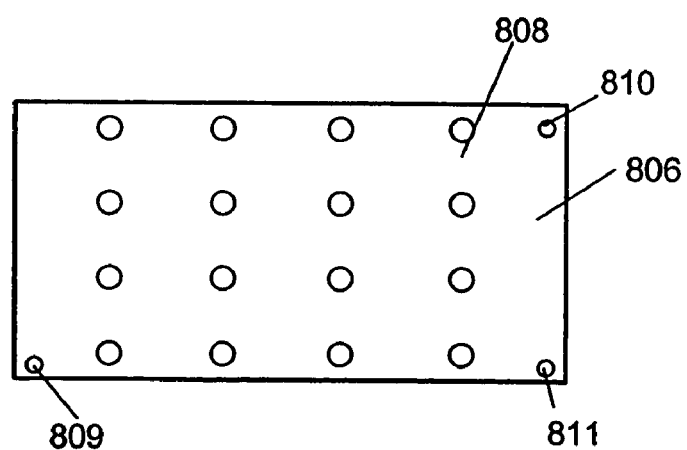
FIG. 8B shows the placement of pins or protrusions on the land grid array socket shown in FIG. 8A.
Figure 8C:
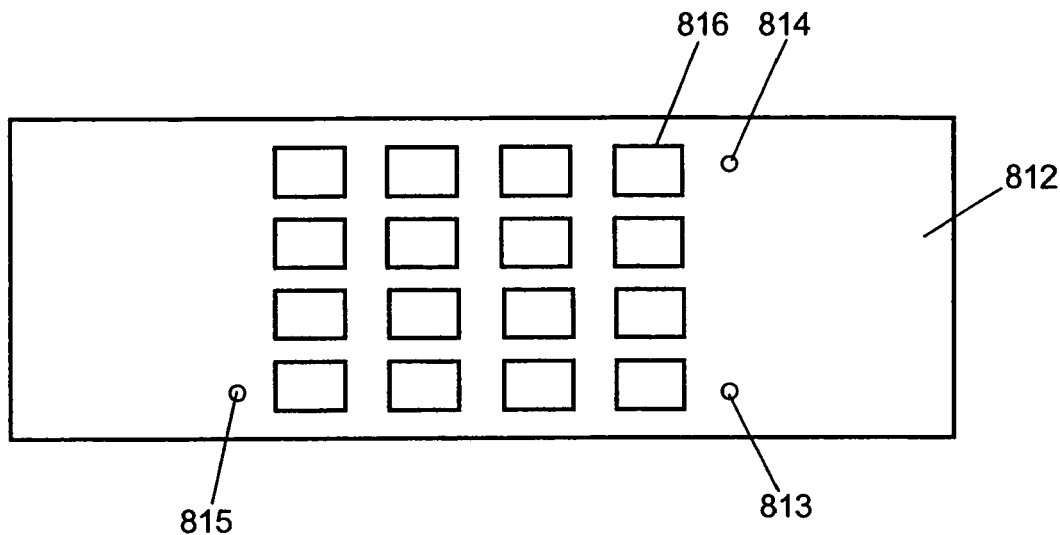
FIG. 8C shows the placement of holes or indentures on a target circuit board with an array of electrical contacts as shown in FIG. 8A.
Figure 8D:
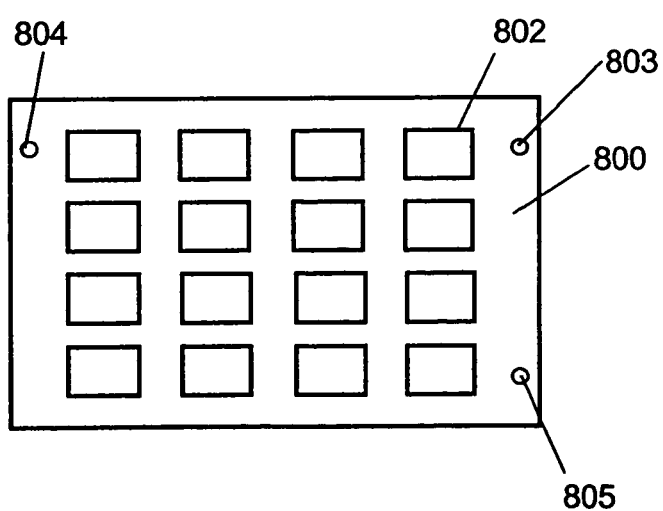
FIG. 8D shows the placement of holes or indentures on a circuit board with an array of electrical contacts, as shown in FIG. 8A.

FIGS. 8A to 8D show a guiding mechanism that accurately connects an LGA socket 806 to arrays of electrical contact points 802 and 816 on two opposing circuit boards 800 and 812. FIG. 8A is a side view of the guiding mechanism, while FIG. 8B is a top view of the guiding mechanism as viewed along line 8'-8' of FIG. 8A. FIG. 8C is a top view of the target circuit board 812, while FIG. 8D is a bottom view of the memory module circuit board 800. This guiding mechanism for guiding the connection between the circuit boards 800 and 812, allows the contacts 802 and 816 of the circuit boards 800 and 812 to accurately align with the protruding structures 808 of the LGA socket 806.

A set of holes or cavities 803, 804, 805 and 813, 814, 815 are formed in both of the circuit boards 800 and 812. These holes or cavities 803, 804, 805 and 813, 814, 815 are made to accommodate the corresponding pegs or protruding structures 809, 810, 811 that extend out from both faces of the LGA socket 806. The height of the pegs or protrusions 809, 810, 811 corresponds to the depth of the cavities 803, 804, 805 and 813, 814, 815, such that the pegs or pins 809, 810, 811 fit into the cavities or holes 803, 804, 805 and 813, 814, 815. This allows for the accurate alignment of the protruding structures 808 of the LGA 806 to contact the electrical contact points 802 and 816 on the two circuit boards 800 and 812. The holes or cavities 803, 804, 805 and 813, 814, 815 match up with the pegs or protrusions 809, 810, 811 such that the contact pins of the LGA socket 808 align with the arrays of electrical contact points 802 and 816 on both circuit boards correctly. In one embodiment, three pegs 809, 810, and 811 are provided to ensure accurate alignment of the contact points 802 and 816. In an alternative embodiment, the pegs are provided on the circuit boards 800 and 812, and the holes are provided on the socket 806.

If holes instead of cavities are used, then the spacing between the LGA socket and the circuit boards depends on the height of the pins being used and the clamping mechanism used to keep the assembly together. The pegs and protrusions may be made of any suitable material, including metals or plastics. Alternatively, the pegs or protrusions need not be separate parts of the LGA socket, but may be made by creating bumps or other structures on the surfaces of both sides of the LGA socket. Alternatively, the holes or cavities are disposed on the LGA socket while the pegs or protrusions are disposed on the circuit boards. It should, however, be appreciated that any other suitable intermediary device may be used to electrically connect the arrays of contact points on the two circuit boards.

The memory module described above has a number of advantages. For example, a larger number of inputs and outputs is included per unit area, as compared with card edge connectors. In addition, the memory module can be produced for a lower cost than other high pin count modules, such as the "gold dot" type of connectors. Moreover, the memory module has better electrical characteristics than the prior art modules, while requiring a lower force per pin to couple the memory module to a target board.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A memory module comprising:
   a first circuit board having at least one memory chip disposed thereon;
   a second circuit board having a first area array of electrical contact pads disposed thereon;
   a flexible connector coupling the first circuit board to the second circuit board; and
   a guiding mechanism formed either (i) on the second circuit board between the second circuit board and an intermediary device, or (ii) formed in the second circuit board, and configured to coaxially align the first array of electrical contact pads with: (i) a second area array of electrical contacts on an intermediary device, and (ii) a third area array of electrical contact pads on a target circuit board, wherein the guiding mechanism is distinct from the first array of electrical contact pads.

2. The memory module of claim 1, wherein the first area array of electrical contact pads is configured to be electrically coupled to the third area array of electrical contact pads via the intermediary device.

3. The memory module of claim 1, wherein the at least one memory chip is electrically coupled to the first area array of electrical contact pads via the flexible connector.

4. The memory module of claim 1, wherein the flexible connector contains multiple electrical pathways.

5. The memory module of claim 1, wherein memory chips are attached to opposing planar surfaces of the first circuit board.

6. The memory module of claim 1, wherein the second area array of electrical contacts are an array of protruding structures.

7. The memory module of claim 6, wherein each of the protruding structures is resilient along a line joining respective contact pads of the first area array of electrical contacts and contacts of the second area array of electrical contacts.

8. The memory module of claim 6, wherein the guiding mechanism is configured to ensure that each of the contact pads of the first area array aligns with a corresponding one of the protruding structures.

9. The memory module of claim 1, wherein the guiding mechanism comprises one or more holes formed in the second circuit board that are each configured and dimensioned to receive a corresponding pin that extends from the intermediary device.

10. The memory module of claim 1, wherein the guiding mechanism comprises one or more pins that extend from the second circuit board and are each configured and dimensioned to be received a corresponding hole in the intermediary device.

11. The memory module of claim 1, wherein the flexible connector comprises one or more flexible circuit boards.

12. The memory module of claim 1, wherein the first and second circuit boards comprise substantially rigid sections of a rigid/flex circuit board and the flexible connector comprises a flexible part of the rigid/flex circuit board.

13. The memory module of claim 1, further comprising at least one additional memory chip disposed on, and electrically connected to, the second circuit board.

14. The memory module of claim 1, wherein the first array of electrical contact pads are gold.

15. The memory module of claim 1, wherein the coupling of the first circuit board to the second circuit board through the flexible connector is not via the intermediary device.

16. The memory module of claim 1, wherein the first circuit board does not contact the intermediary device.

17. A memory module comprising:
   a first circuit board having at least one memory chip disposed thereon;
   a second circuit board having an area array of electrical contact pads disposed thereon;
   a flexible connector electrically coupling the first circuit board to the second circuit board, such that the memory chip is at least partially electrically connected to the area array of electrical contact pads; and
   a guiding mechanism formed on the second circuit board between the second circuit board and an intermediary device or formed in the second circuit board and configured to coaxially align the array of electrical contact pads for engagement to a target circuit board via an intermediary device, wherein the guiding mechanism is distinct from the array of electrical contact pads.

18. The memory module of claim 17, wherein the guiding mechanism is further configured to align the area array of electrical contact pads with an additional area array of electrical contact pads on a target circuit board, where the area array of electrical contact pads is configured to be electrically coupled to the additional area array of electrical contact pads via the intermediary device.

19. The memory module of claim 17, wherein the flexible connector contains multiple electrical pathways.

20. The memory module of claim 17, wherein the guiding mechanism is further configured to align the array of electrical contact pads with an array of protruding structures on the intermediary device.

21. The memory module of claim 20, wherein each of the protruding structures is resilient along a line joining respective contacts of the area array of electrical contacts and the array of protruding structures.

22. The memory module of claim 17, wherein the guiding mechanism comprises one or more holes formed in the second circuit board that are each configured and dimensioned to receive a corresponding pin that extends from the intermediary device.

23. The memory module of claim 17, wherein the guiding mechanism comprises one or more pins that extend from the second circuit board and are each configured and dimensioned to be received a corresponding hole in the intermediary device.

24. The memory module of claim 17, wherein the first array of electrical contact pads are gold.

25. A memory module comprising:
a first circuit board having at least one electrical component disposed thereon;
a second circuit board having a first array of electrical contact pads disposed thereon;
a flexible connector at least partially electrically coupling the at least one electrical component to the first array of electrical contact pads; and
a guiding mechanism formed on the second circuit board between the second circuit board and an intermediary device or formed in the second circuit board and configured to coaxially align the first array of electrical contact pads with both a second array of electrical contacts on an intermediary device and a third array of electrical contact pads on a target circuit board, where the first array of electrical contact pads is configured to electrically couple to the third array of electrical contact pads via the intermediary device, wherein the guiding mechanism is distinct from the first array of electrical contact pads and is also distinct from the third array of electrical contact pads.

26. The memory module of claim 25, wherein the at least one electrical component is a memory chip.

27. The memory module of claim 26, wherein memory chips are attached to opposing planar surfaces of the first circuit board.

28. The memory module of claim 25, wherein the second array of electrical contacts are an array of protruding structures.

29. The memory module of claim 28, wherein each of the protruding structures is resilient along a line joining respective contacts of the first area array of electrical contacts and the second area array of electrical contacts.

30. The memory module of claim 25, wherein the guiding mechanism comprises one or more holes formed in the second circuit board that are each configured and dimensioned to receive a corresponding pin that extends from the intermediary device.

31. The memory module of claim 25, wherein the guiding mechanism comprises one or more pins that extend from the second circuit board and are each configured and 28.

32. The memory module of claim 25, wherein the first and second circuit boards comprise substantially rigid sections of a rigid/flex circuit board and the flexible connector comprises a flexible part of the rigid/flex circuit board.

33. The memory module of claim 25, wherein the first array of electrical contact pads are gold.

* * * * *

UNITED STATES PATENT AND TRADEMARK OFFICE
CERTIFICATE OF CORRECTION

PATENT NO.          : 7,417,871 B2                                           Page 1 of 1
APPLICATION NO.  : 11/327267
DATED                  : August 26, 2008
INVENTOR(S)         : Haba It is certified that error appears in the above-identified patent and that said Letters Patent is hereby corrected as shown below:

Column 8, line 20, please insert --within-- between "received" and "a";

Column 9, line 13, please insert --within-- between "received" and "a";

Column 10, line 25, please delete "and are each configured and 28".

Signed and Sealed this

Eighteenth Day of May, 2010

David J. Kappos
*Director of the United States Patent and Trademark Office*